(12) United States Patent
Barnes

(10) Patent No.: US 6,320,445 B1
(45) Date of Patent: Nov. 20, 2001

(54) CIRCUITRY AND A METHOD FOR INTRODUCING A DELAY

(75) Inventor: William Barnes, Bristol (GB)

(73) Assignee: STMicroelectronics Limited, Almondsbury Bristol (GB)

(*) Notice: Subject to any disclaimer, the term of this patent is extended or adjusted under 35 U.S.C. 154(b) by 0 days.

(21) Appl. No.: 09/466,328

(22) Filed: Dec. 17, 1999

(30) Foreign Application Priority Data

Dec. 18, 1998 (GB) .................................................. 9828037

(51) Int. Cl.[7] .................................................. H03H 11/26
(52) U.S. Cl. .................................................. 327/284; 327/277
(58) Field of Search .................................................. 327/261, 277, 327/284, 393–396

(56) References Cited

U.S. PATENT DOCUMENTS

| 5,118,975 | * 6/1992 | Hillis et al. | 327/158 |
| 5,394,024 | 2/1995 | Buckenmaier et al. | 327/160 |
| 5,646,564 | 7/1997 | Erickson et al. | 327/158 |

FOREIGN PATENT DOCUMENTS

| 0 181 047 | 5/1986 | (EP) | H03K/5/13 |
| 0 613 245 | 8/1994 | (EP) | H03K/5/13 |

* cited by examiner

Primary Examiner—Toan Tran
Assistant Examiner—Cassandra Cox
(74) Attorney, Agent, or Firm—Wolf, Greenfield & Sacks, P.C.; James H. Morris

(57) ABSTRACT

Circuitry for introducing a delay to a signal comprising input means for receiving the signal to be delayed; a first delay path; a second delay path; selection means for causing the signal passing through a selected one of the delay paths to be output from said circuitry; comparing means for comparing the phase difference between the signal output by said circuitry and the input to said selected delay path to provide a first comparison signal and for comparing the phase delay of said first delay path with that of said second delay path to provide a second comparison signal, wherein said first and second comparison signals are used by the selection means to determine which of said delay paths selected.

21 Claims, 2 Drawing Sheets

CIRCUITRY AND A METHOD FOR INTRODUCING A DELAY

FIELD OF THE INVENTION

The present invention relates to circuitry for introducing a delay and a method for introducing a delay and in particular, but not exclusively to a method and circuitry for introducing a delay to an output clock signal.

BACKGROUND OF THE INVENTION

Clock signals are used to control the timing of circuits and for example control when signals are to be applied and when certain operations are to commence. one example of a known arrangement which uses clock signals is shown in FIG. 1. A synchronous dynamic random access memory SDRAM 2 receives three inputs 4, 6 and 8 from an interface 10. The first input 4 provides a clock signal, the second input 6 provides data to be written into the SDRAM 2 whilst the third input 8 provides the address at which the data is to be written. The clock signal input to the SDRAM 2 from the first input 4 controls the timing of the operation of the SDRAM 2 such as the opening and closing of pages of the SDRAM 2 and the writing of the data into the required locations.

The clock signal input to the SDRAM 2 is generated from the internal clock φ of the interface 10. The internal clock φ passes through elements which introduce varying amounts of delay. These elements are represented by delay 14. In practice the amount of delay provided by the delay elements varies over time, for example due to changes in temperature. The interface 10 uses the internal clock φ to control the timing of the data and address signals. In order to ensure that the SDRAM 2 operates correctly, it should be ensured that the internal clock φ signal is in phase with the clock signal output by the interface 10. Generally, problems are avoided if the internal clock φ is in phase with the output clock even if the output clock is delayed with respect to the internal clock φ. A number of solutions have been proposed to ensure that the internal clock φ and the output clock are in phase.

In one solution, the internal clock φ is input to a variable delay 12, the output of which is connected to delay 14 which varies with time due to changes in temperature. The output of the delay 14 provides the clock output of the interface 10 which is input to the SDRAM 2. The internal clock φ is also input to a comparator 16 which also receives the output from the delay 14. The comparator 16 compares the phase of the internal clock φ with the phase of the signal output by the delay 14. The comparator 16 generates a control signal which is output to the variable delay 12 based on the results of the comparison. The control signal is arranged to cause the delay provided by the variable delay 12 to be such that the phase difference between the compared signals is n×360° where n is an integer.

The variable delay 12 can take the form shown in FIG. 2. The variable delay 12 shown in FIG. 2 provides a single delay path with a series of outputs 20 along its length. Each of the outputs 20 provide a different delay with those outputs 20 which are closest to the input providing the shortest delays and those outputs closest to the output of the variable delay 12 providing the longest delays. The delay provided by the variable delay 12 is varied by selecting the appropriate output. Consider the case where the delay provided by variable delay 12 is being reduced and the output nearest to the input of the variable delay provides the current output with a delay of x°. In order to effectively reduce the phase by y° it is necessary to go to the output which provides a delay of 360+(x−y)°. In order to ensure that this transition is available, it is necessary to ensure that the delay values of x and (x−y)+360° are both available at the same time and that the delay can be adjusted as required. These two requirements results in the need for two control loops one for defining the active part of the path and one loop to select the required delay from the active path. The active part of the delay path is that part of the path from which the delay outputs are taken. Transitions can thus be made from one part of the path to another as described hereinbefore. Typically, the path is regulated to ensure that its length is one clock cycle and that the required delay is selected from an appropriate point along it.

The provision of a multi output variable delay is disadvantageous in that the delay itself as well as the regulation mechanism can be costly in terms of silicon area. Additionally the regulation mechanism is an analogue structure which can be complex to design.

As an alternative to the regulation of the path, the variable delay can be constructed to be much longer than one clock cycle so that sufficient delay and resolution are always available. However, this solution also requires a large silicon area.

Variable delay paths with single outputs are known but also suffer from the problems relating to transitions from a delay of a° to a delay of a+360°.

Another solution which has been proposed to deal with the alteration in the phase of the clock signal output by the interface 10 as compared to the internal clock signal φ is to use a phase locked loop. However, this solution is disadvantageous in that phase locked loops are not particularly robust and are complex. Accordingly it is preferred to avoid the use of phase locked loops in at least some applications.

SUMMARY OF THE INVENTION

It is therefore an aim of some embodiments of the present invention to overcome or at least mitigate the problems described hereinbefore.

According to one aspect of the present invention, there is provided circuitry for introducing a delay to a signal comprising input means for receiving the signal to be delayed; a first delay path; a second delay path; and selection means for causing the signal passing through a selected one of the delay paths to be output from said circuitry.

By having two separate delay paths, it is possible to switch between the paths. This makes it simpler, as compared to the arrangements described hereinbefore, to control the delay, particularly when the ends of the delay paths are reached. In embodiments of the present invention, the two delay paths may be shorter than those of the prior art and additionally simpler.

Preferably, at least one of said first and second paths are variable delay paths. One path may be fixed in length. One path, preferably a fixed length path may be shorter than the other path. It is also preferred that the variable delay paths only provide a single output.

Preferably, delaying means are arranged between an output of the selected delay path and the output of the circuitry. The delaying means may take the form of any suitable elements which may introduce a delay, such as a driver or the like.

Comparing means are preferably provided for comparing the phase of the signal output by said circuitry and the phase of the signal prior to being input to the selected path. In this way, it can be determined whether or not the correct delay is being provided by the selected path and if not the delay provided by the selected delay path can be altered. Accordingly, the output of the comparing means preferably provides an output signal which is used to determine the delay provided by the selected delay path. The output signal may be arranged to determine the delay provided in a selected delay path so that the phase difference between the signal output by the circuitry and the signal input to the selected delay path is substantially equal to n×360°, where n is an integer.

Preferably, the delay introduced by the selected delay path is less than or equal to 1 cycle.

The signal to be delayed is preferably input to both the first and second delay paths. Comparator means are preferably provided for comparing the phase of the signals output from the first and second delay paths. The output of the comparator means may be used in controlling the switching between the selected and deselected path.

Preferably, control means are arranged for determining which of the first and second delay paths is selected. The control means preferably receives inputs from the comparing and/or comparator means. The control means may be arranged to determine it the phase delay of the selected path is increasing and/or decreasing. If the phase delay of the selected path is increasing, and the phase delay of the unselected path is less than the selected path, then the phase delay of the unselected path is unchanged. If the phase delay of the selected path is increasing, and the phase delay of the unselected path is greater than the selected path, then the phase delay of the deselected path may be reduced. If the phase of the selected path is decreasing and the phase delay of the unselected path is greater than that of the selected path, then the phase delay of the unselected path may be unchanged. If the phase of the selected path is decreasing and the phase delay of the unselected path is less than that of the selected path, then the phase delay is increased.

In the case where the phase delay of the unselected path is reduced, the phase delay may be decreased to a minimum value or to a value which is 360° less than its current value. Likewise, if the phase delay is to be increased, then the phase delay is increased to a maximum value or to a value 360° greater than the current value.

Preferably, the selected path is deselected when the phase delay exceeds or falls below respective predetermined values. These predetermined values may be the maximum or minimum values or may be values greater than or less than the minimum and maximum values respectively.

According to a second aspect of the present invention, there is provided a method of introducing a delay to a signal comprising the steps of inputting a signal to be delayed; causing said signal to pass through at least one of a plurality of delay paths; and selecting the output from one of said plurality of delay paths and outputting said output.

Preferably, the signal passes through all of said delay paths.

BRIEF DESCRIPTION OF THE DRAWINGS

For a better understanding of the present invention and as to how the same may be carried into effect, reference will now be made by way of example to the accompanying drawings in which.

DETAILED DESCRIPTION OF EMBODIMENTS OF THE INVENTION

Figure 3:
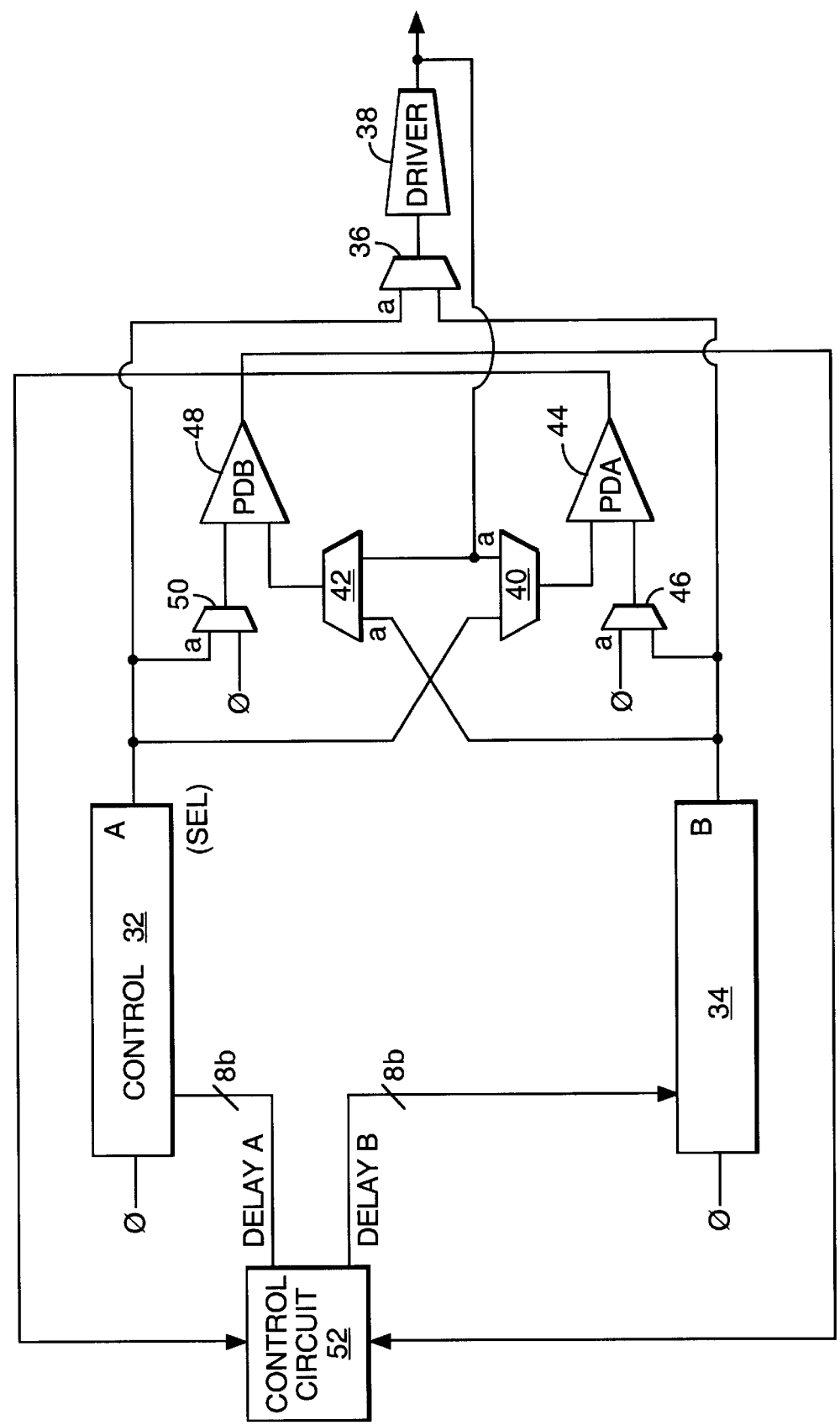
FIG. 3 shows a schematic diagram of an embodiment of the present invention.

Reference will now be made to FIG. 3 which shows circuitry 30 embodying the present invention which can be used in an interface output the internal clock φ and not the output of the second delay path 34. The first comparator 44 is arranged to compare the phase of the internal clock φ with that of the signal output by the driver 38 and to output a signal to the control circuit 52. This signal is used by the control circuit 52 to determine if the delay of the first delay path 32 is to be altered and to output the appropriate control signal to the first delay path 32.

The control circuit 52 uses the output of the first and second comparators 44 and 48 to determine the delay of the first and second delay paths 32 and 34 and also control the switching between the first and second delay paths 32 and 34. In particular, the control circuit 52 is arranged to set the delay of both of the first and second delay paths 32 and 34 to appropriate values even though only one of the paths is the selected path.

It should be appreciated that when the second delay path 34 is the selected path, then the second comparator 48 compares the output of the driver 38 with the internal clock φ. The first comparator 44 is arranged to compare the output of the second delay path 34 with the output of the first delay path 32.

Figure 1:
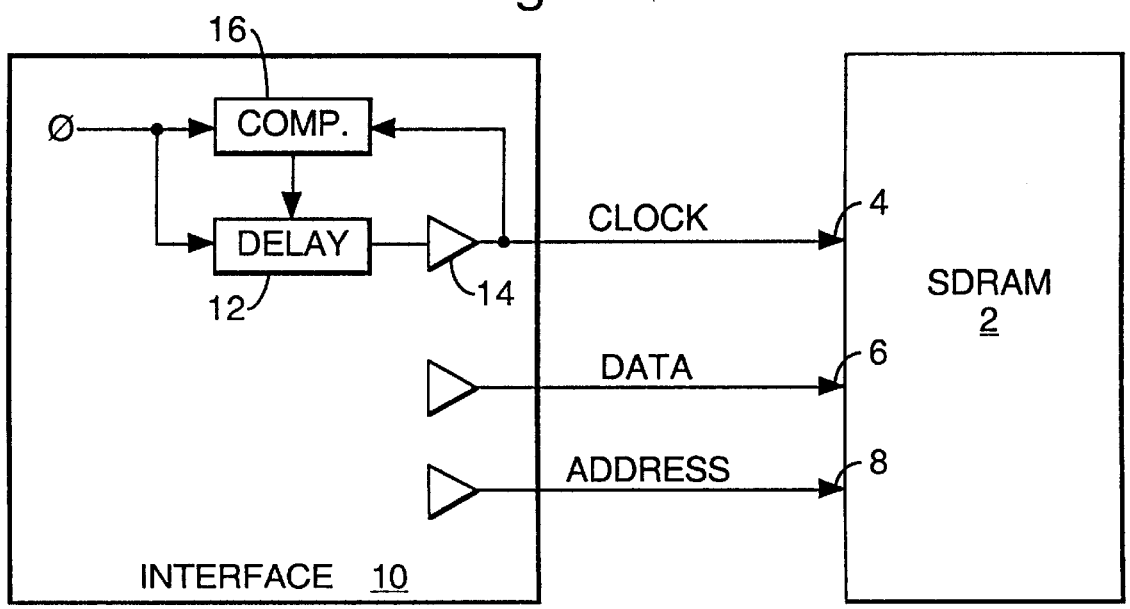
FIG. 1 shows a known arrangement incorporating a SDRAM which uses clock signals.
Figure 2:
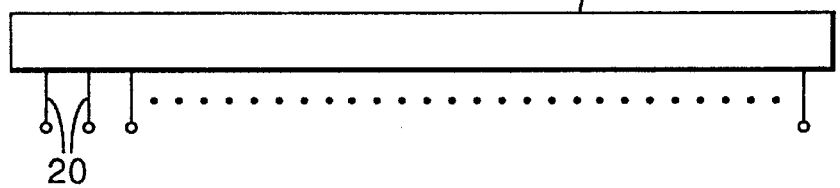
FIG. 2 shows a known variable delay which could be used in arrangement shown in FIG. 1.

The control of the switching between the first and second delay paths 32 and 34 will now be described. The control circuit 52 uses the values of the signals which are output to control the first and second delay paths as well as the comparison on the outputs of the first and second paths 32 and 34. If the phase delay to be provided by the selected path is increasing and the deselected path is set at a phase delay value which is less than that of the selected path, then no action is required. If on the other hand, the phase delay provided by the selected path is increasing and the deselected path is set at a delay which is greater than the selected path, then the deselected path is controlled to reduce its delay either to the minimum possible delay or to a lower phase delay value. That lower phase delay may be n×360° less than the previous delay value of the deselected such as shown in FIG. 1.

The circuitry 30 comprises first and second delay paths 32 and 34 respectively. The first and second delay paths 32 and 34 are variable delay paths, each of which has a single output. The first and second delay paths 32 and 34 each receive an input from an internal clock φ. The outputs of each of the delay paths 32 and 34 are connected to a first multiplexer 36. The output of the first multiplexer 36 is input to a driver 38 which further delays the output of the first multiplexer 36. The amount by which the driver 38 delays the signal may vary with temperature. The output of the driver 38 provides the output clock signal which may for example he output to the SDRAM 2 of FIG. 1.

The output of the first delay path 32 is also input to a second multiplexer 40 which also receives an output from the driver 38. Likewise, the output of the second delay path 34 is also input to a third multiplexer 42 which also receives the output from the driver 38. The output of the second multiplexer 40 is input to a first comparator 44 which also receives a second input from a fourth multiplexer 46. The fourth multiplexer 46 receives a first input of the internal clock φ and a second output from the output of the second delay path 34. In a similar manner, the output of the third multiplexer 42 is connected to a first input of a second comparator 48 which ha s a second input connected to the output of a fifth multiplexer 50. The fifth multiplexer 50 receives an input from the internal clock φ and an input from the output of the firs t delay path 32.

The output of the first comparator 44 is connected to the input of a control circuit 52. The output of the second comparator 48 is also connected to an input of the control circuit 52. The control circuit 52 generates control signals which are used to control the amount of delay provided by the first and second delay paths 32 and 34. Accordingly, two outputs are provided from the control circuitry 52. One output is to the first delay path 32 and the other output is to the second delay path 34.

The first to fifth multiplexers 36 to 50 may be controlled by the control circuit 52. For clarity the connections between the multiplexers and the control circuit are not shown.

The operation of the circuitry 30 shown in FIG. 3 will now be described. In the following, it is assumed that the first delay path 32 is the selected path. In other words, the clock signal which is output by the driver 38 has passed through the first delay path 32 and not the second delay path 34.

The internal clock φ is input to both of the first and second delay paths 32 and 34 which apply respective delays to the internal clock φ. The respective delays are determined by the control circuit 52. The output of the first delay path 32 is input to the first multiplexer 36, the second multiplexer 40 and the fifth multiplexer 50. Likewise the output of the second delay path 34 is output to the first multiplexer 36, the third multiplexer 42 and the fourth multiplexer 46.

The first multiplexer 36 is controlled to output the signal of the first delay path 32. The fifth multiplexer 50 is arranged to output the output from the first delay path 32 and not the internal clock φ to the second comparator 48. The third multiplexer 42 is arranged to select the output of the second delay path 34 and not the output from the driver 38. Accordingly, the second comparator 48 is arranged to compare the phase of the output of the first delay path 32 with the phase of the output of the second delay path 34. The output of the second comparator 48 is output to the control circuit 52. The purpose of the output of the second comparator 48 will be described hereinafter.

The second multiplexer 40 is controlled to output the input received from the output of the driver 38 and not the output from the first delay path 32. The fourth multiplexer 46 is arranged to delay path where n is an integer If the phase delay provided by the selected path is decreasing and the deselected path is locked at a delay which is greater than that of the selected path, then no action is required. If on the other hand the phase delay provided by the selected path is decreasing, and the deselected path is locked at a delay which is less than that of the selected path, then the deselected path is controlled to increase its delay either to the maximum possible value or a higher phase delay value. That higher phase delay may be n×360° greater than the previous delay value of the deselected delay path where n is an integer.

If the phase delay value of the selected path has increased to its maximum value, the selected path will become the deselected path and the deselected path will become the selected path. Due to the control by the control circuit 52, the deselected path will either be at a minimum value or at a lower phase delay value. In that way, the phase value can continue to be increased when a switch is subsequently made to the deselected path.

Likewise, if the delay in the selected path is reducing, the selected path will become the deselected path when the phase delay value can no longer be reduced. The deselected path will then become the selected path. Again, due to the control of the control circuit 52, the deselected path (now the selected path) will have a phase delay value which is either at the maximum or at least higher than the minimum value and it is possible to continue to decrease the phase value.

It should be appreciated that as embodiments of the present invention deal with a regular repeating signal, such as a clock signal, that increasing the delay by 360−x° is equivalent to decreasing the delay by x°. In practice, the delays will be measured by the number of counts or the like.

It should be appreciated that in some embodiments of the present invention, a safety margin may be used by the control circuit 52 to take into account differences between the first and second delay paths. Even if the first and second delay paths are intended to be identical, in practice differences will arise. Accordingly, the control circuit may, when the phase delay of the selected path is increasing, reduce the phase of the deselected path when the phase delay of the deselected path plus x° is greater than the phase of the selected path. Likewise, when the phase of the selected path is decreasing, the delay of the deselected path will be increased when the phase of the selected path is greater than the phase of the deselected path plus y°. x and y may be the same or different values.

As mentioned hereinbefore, it is preferred (but not essential) that the two delay paths are the same in terms of the length and hence the maximum amount of delay provided. However in some embodiments of the present invention, one path may be longer than the other so that the selected path is usually the longer path. The length of the first and second delay paths will generally be equal to at least one cycle. The delay provided by the paths will vary with temperature. Accordingly, it should be ensured that even in the worst possible conditions, each path still provides at least one cycle.

In alternative embodiments of the invention, one of the first and second paths may be shorter than one cycle and only used whilst the longer path has its delay adjusted to a more appropriate value. One path may provide no delay.

The delay paths are digitally controlled by the control circuit 52.

Figure 4:
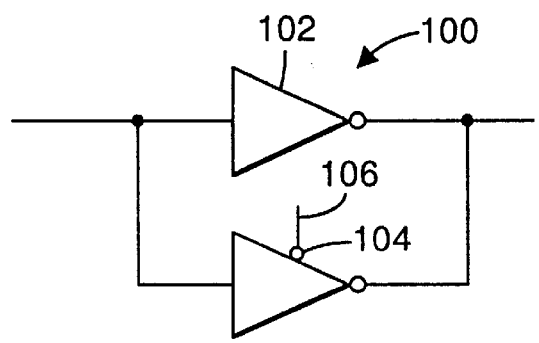
FIG. 4 shows an element of one of the delay paths shown in FIG. 3.

Reference will now be made to FIG. 4 which shows one element 100 of one of the delay paths shown in FIG. 3. Each element comprises an inverter 102 and a tristate inverter 104. The internal clock signal is input to each element 100. When the internal clock signal only passes through the inverter 102, a relatively long delay is induced. The tristate inverter 104 will be in an open circuit state controlled by the input on the input 106. When a smaller delay is required from the element 100, the internal clock signal is passed through the tristate inverter 104 which is much stronger and drives the received signal more quickly through the element 100. The tristate inverter 104 is enabled by an enable signal on input 106. The delay paths each comprise a number of these elements. The required delay is selected by passing the internal clock signal through the first inverter 102 and/or the tristate inverter 106 of the elements 100.

The internal clock signal may by generated by the device in which the circuitry shown in FIG. 3 is incorporated or may be received or derived from an external source.

It should be appreciated that embodiments of the present invention can be used in any arrangement which uses a clock or similar signal. Whilst the embodiment of the present invention has been described as using two delay paths, embodiments of the present invention may use more than two delay paths if appropriate.

What is claimed is:

1. Circuitry for introducing a delay to a signal, comprising:
    input means for receiving the signal to be delayed;
    a first delay path;
    a second delay path;
    selection means for causing the signal passing through a selected one of said first and second delay paths to be output from said circuitry;
    control means for controlling said selection means; and
    comparing means for comparing a phase difference between the signal output by said circuitry and an input to said selected delay path to provide a first comparison signal and for comparing a phase delay of said first delay path with that of said second delay path to provide a second comparison signal, wherein said first and second comparison signals are used by the control means to determine whether to change said selected delay path.

2. Circuitry as claimed in claim 1, wherein at least one of said first and second delay paths is a variable delay path.

3. Circuitry as claimed in claim 1, wherein at least one of the said first and second delay paths is fixed in length.

4. Circuitry as claimed in claim 1, wherein delaying means is arranged between an output of said selection means and the output of said circuitry.

5. Circuitry as claimed in claim 1, wherein the output of said comparing means provides an output signal which is used to determine a delay provided by said selected delay path.

6. Circuitry as claimed in claim 1, wherein said first comparison signal is used by the control means to determine a delay provided by said selected delay path so that the phase difference between the signal output by said circuitry and the signal input to said selected delay path is substantially equal to $n \times 360°$, where n is an integer.

7. Circuitry as claimed in claim 1, wherein the delay introduced by said selected delay path is less than or equal to one cycle.

8. Circuitry as claimed in claim 1, wherein the signal to be delayed is input to both said first and second delay paths.

9. Circuitry as claimed in claim 1, wherein the control means is arranged to determine if the phase delay of said selected path is increasing or decreasing.

10. Circuitry as claimed in claim 1, wherein if the phase delay of said selected path is increasing, and the phase delay of the unselected path is less than the phase delay of said selected path, then the phase delay of the unselected path is unchanged.

11. Circuitry as claimed in claim 1, wherein if the phase delay of said selected path is increasing, and the phase delay of the unselected path is greater than the phase delay of said selected path, then the phase delay of the unselected path is reduced.

12. Circuitry as claimed in claim 1, wherein if the phase delay of said selected path is decreasing and the phase delay of the unselected path is greater than the phase delay of said selected path, then the phase delay of the unselected path is unchanged.

13. Circuitry as claimed in claim 1, wherein if the phase of said selected path is decreasing and the phase delay of the unselected path is less than the phase delay of said selected path, then the phase delay of the unselected path is increased.

14. Circuitry as claimed in claim 1, wherein said selected path is deselected when the phase delay of said selected path exceeds or falls below respective predetermined values.

15. Circuitry as claimed in claim 1, wherein the signal is a clock signal.

16. A method of introducing a delay to a signal comprising steps of:
    receiving a signal to be delayed;
    passing said input signal through a plurality of delay paths;
    selecting an output signal from a first delay path of said plurality of delay paths and outputting a delayed output signal corresponding to said selected output signal;
    comparing a phase difference between the delayed output signal and said input signal passed to said selected delay path to provide a first comparison signal; and
    comparing a phase delay of said selected delay path with a phase delay of a second delay path of said plurality of delay paths to provide a second comparison signal;
    wherein said step of selecting includes a step of using said first and second comparison signals to determine whether to change said selected delay path.

17. Circuitry as claimed in claim 1, wherein the control means includes means for determining whether a delay of said selected delay path is to be adjusted based upon said first and second comparison signals.

18. Circuitry as claimed in claim 1, wherein the control means includes means for determining whether said selected delay path is to be unselected based upon said first and second comparison signals.

19. A delay circuit for delaying an input signal, comprising:
    a first delay path to receive the input signal and provide a first delayed output signal;
    a second delay path to receive the input signal and provide a second delayed output signal;
    a first comparator to receive the input signal and a selected delayed output signal, compare a phase of the input signal with a phase of the selected delayed output signal, and provide a first comparison signal;
    a second comparator to receive the first delayed output signal and the second delayed output signal, compare the phase of the first delayed output signal with a phase of the second delayed output signal, and provide a second comparison signal;
    a multiplexer to receive the first and second delayed output signals and select one of the first and second delayed output signals as the selected delayed output signal; and
    a control circuit to receive the first and second comparison signals and determine which of the first and second delayed output signals is selected by the multiplexer as the selected delayed output signal.

20. The delay circuit of claim 19, wherein the control circuit is adapted to adjust an amount of delay of the first delayed output signal during a period in which the first delayed output signals is the selected delayed output signal.

21. The delay circuit of claim 19, wherein the control circuit is adapted to adjust an amount of delay of the first and second delayed output signals during a period in which only one of the first and second delayed output signals is the selected delayed output signal.

* * * * *

UNITED STATES PATENT AND TRADEMARK OFFICE
CERTIFICATE OF CORRECTION

PATENT NO. : 6,320,445 B1
DATED : November 20, 2001
INVENTOR(S) : William Barnes It is certified that error appears in the above-identified patent and that said Letters Patent is hereby corrected as shown below:

Column 5,
Beginning at line 47 should read as follows:

The second multiplexer 40 is controlled to output the input received from the output of the driver 38 and not the output from the first delay path 32. The fourth multiplexer 46 is arranged to output the internal clock φ and not the output of the second delay path 34. The first comparator 44 is arranged to compare the phase of the internal clock φ with that of the signal output by the driver 38 and to ouput a signal to the control circuit 52. This signal is used by the control circuit 52 to determine if the delay of the first delay path 32 is to be altered and to output the appropriate control signal to the first delay path 32.

The control circuit 52 uses the output of the first and second comparators 44 and 48 to determine the delay of the first and second delay paths 32 and 34 and also control the switching between the first and second delay paths 32 and 34. In particular, the control circuit 52 is arranged to set the delay of both of the first and second delay paths 32 and 34 to appropriate values even though only one of the paths is the selected path.

It should be appreciated that when the second delay path 34 is the selected path, then the second comparator 48 compares the output of the driver 38 with the internal clock φ. The first comparator 44 is arranged to compare the output of the second delay path 34 with the output of the first delay path 32.

The control of the switching between the first and second delay paths 32 and 34 will now be described. The control circuit 52 uses the values of the signals which are output to control the first and second delay paths as well as the comparison on the outputs of the first and second paths 32 and 34. If the phase delay to be provided by the selected path is increasing and the deselected path is set at a phase delay value with is less than that of the selected path, then no action is required. If on the other hand, the phase delay provided by the selected path is increasing and the deselected path is set at a

UNITED STATES PATENT AND TRADEMARK OFFICE
CERTIFICATE OF CORRECTION

PATENT NO.    : 6,320,445 B1
DATED         : November 20, 2001
INVENTOR(S)   : William Barnes It is certified that error appears in the above-identified patent and that said Letters Patent is hereby corrected as shown below:

delay which is greater than the selected path, then the deselected path is controlled to reduce its delay either to the minimum possible delay or to a lower phase delay value. That lower phase delay may be n x 360° less than the previous delay value of the deselected delay path where n is an integer.

Signed and Sealed this

Twenty-third Day of April, 2002

Attest:

Attesting Officer

JAMES E. ROGAN
Director of the United States Patent and Trademark Office

UNITED STATES PATENT AND TRADEMARK OFFICE
CERTIFICATE OF CORRECTION

PATENT NO. : 6,320,445 B1
DATED : November 20, 2001
INVENTOR(S) : William Barnes It is certified that error appears in the above-identified patent and that said Letters Patent is hereby corrected as shown below:

<u>Column 4,</u>
Lines 8-47, delete and replace it with the following: -- Reference will now be made to FIG. 3 which shows circuitry 30 embodying the present invention which can be used in an interface such as shown in FIG. 1. --

Signed and Sealed this

Twenty-fourth Day of December, 2002

JAMES E. ROGAN
*Director of the United States Patent and Trademark Office*